(12) United States Patent
Sugiyama et al.

(10) Patent No.: US 9,478,650 B2
(45) Date of Patent: Oct. 25, 2016

(54) SEMICONDUCTOR DEVICE, HEMT DEVICE, AND METHOD OF MANUFACTURING SEMICONDUCTOR DEVICE

(71) Applicant: NGK Insulators, Ltd., Nagoya-Shi (JP)

(72) Inventors: Tomohiko Sugiyama, Nagoya (JP); Sota Maehara, Nagoya (JP); Shigeaki Sumiya, Handa (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/855,148

(22) Filed: Apr. 2, 2013

(65) Prior Publication Data

US 2014/0042451 A1 Feb. 13, 2014

Related U.S. Application Data (63) Continuation of application No. PCT/JP2012/070521, filed on Aug. 10, 2012.

(51) Int. Cl.
*H01L 29/15* (2006.01)
*H01L 31/0256* (2006.01)
(Continued)

(52) U.S. Cl.
CPC ......... *H01L 29/778* (2013.01); *H01L 21/0237* (2013.01); *H01L 21/0254* (2013.01);
(Continued)

(58) Field of Classification Search
CPC ........... H01L 21/0254; H01L 29/2003; H01L 29/872; H01L 29/7787; H01L 29/66462; H01L 29/778
USPC .......................................................... 257/76
See application file for complete search history.

(56) References Cited

U.S. PATENT DOCUMENTS 6,429,467 B1 * 8/2002 Ando .............................. 257/194
6,495,894 B2 * 12/2002 Shibata et al. ................. 257/428
(Continued)

FOREIGN PATENT DOCUMENTS

CN 102569377 A 7/2012
CN 102576679 A 7/2012
(Continued)

OTHER PUBLICATIONS

Definition of "Compositionally", The Free Dictionary, www.thefreedictionary.com.*
(Continued)

*Primary Examiner* — Jarrett Stark
*Assistant Examiner* — Charles N Ausar-El
(74) *Attorney, Agent, or Firm* — Burr & Brown, PLLC (57) ABSTRACT

Provided is a semiconductor device in which a reverse leakage current is suppressed and the mobility of a two-dimensional electron gas is high. A semiconductor device includes: an epitaxial substrate in which a group of group-III nitride layers are laminated on a base substrate such that a (0001) crystal plane is substantially in parallel with a substrate surface; and a Schottky electrode. The epitaxial substrate includes: a channel layer made of a first group-III nitride having a composition of $In_{x1}Al_{y1}Ga_{z1}N$ (x1+y1+z1=1, z1>0); a barrier layer made of a second group-III nitride having a composition of $In_{x2}Al_{y2}N$ (x2+y2=1, x2>0, y2>0); an intermediate layer made of GaN adjacent to the barrier layer; and a cap layer made of AlN and adjacent to the intermediate layer. A Schottky electrode is bonded to the cap layer.

22 Claims, 4 Drawing Sheets

(51) Int. Cl.
*H01L 29/778* (2006.01)
*H01L 21/02* (2006.01)
*H01L 29/43* (2006.01)
*H01L 29/66* (2006.01)
*H01L 29/205* (2006.01)
*H01L 29/51* (2006.01)
*H01L 29/20* (2006.01)

(52) U.S. Cl.
CPC ..... *H01L21/0262* (2013.01); *H01L 21/02293* (2013.01); *H01L 21/02378* (2013.01); *H01L 21/02381* (2013.01); *H01L 21/02458* (2013.01); *H01L 21/02502* (2013.01); *H01L 29/205* (2013.01); *H01L 29/432* (2013.01); *H01L 29/518* (2013.01); *H01L 29/66462* (2013.01); *H01L 29/7786* (2013.01); *H01L 29/2003* (2013.01)

(56) References Cited

U.S. PATENT DOCUMENTS

| | | | |
|---|---|---|---|
| 7,253,454 B2* | 8/2007 | Saxler | 257/194 |
| 7,709,859 B2* | 5/2010 | Smith et al. | 257/194 |
| 8,541,816 B2* | 9/2013 | Hashimoto et al. | 257/194 |
| 8,614,461 B2* | 12/2013 | Kikkawa | H01L 29/2003 257/192 |
| 8,847,203 B2* | 9/2014 | Ikuta | H01L 21/02381 257/15 |
| 8,853,735 B2* | 10/2014 | Miyoshi | H01L 21/0237 257/102 |
| 8,860,084 B2* | 10/2014 | Miyoshi | H01L 29/7787 257/190 |
| 8,912,571 B2 | 12/2014 | Kanamura et al. | |
| 8,928,000 B2* | 1/2015 | Hung et al. | 257/76 |
| 8,946,723 B2* | 2/2015 | Miyoshi et al. | 257/76 |
| 9,024,325 B2* | 5/2015 | Miyoshi | H01L 29/2003 257/76 |
| 2002/0155649 A1* | 10/2002 | Shibata et al. | 438/200 |
| 2005/0028888 A1* | 2/2005 | Sakai et al. | 148/33 |
| 2007/0164315 A1 | 7/2007 | Smith et al. | |
| 2008/0265258 A1* | 10/2008 | Tanabe et al. | 257/76 |
| 2010/0051961 A1* | 3/2010 | Kuraoka et al. | 257/76 |
| 2010/0327322 A1 | 12/2010 | Kub et al. | |
| 2011/0024795 A1* | 2/2011 | Miyoshi et al. | 257/192 |
| 2011/0024796 A1* | 2/2011 | Miyoshi et al. | 257/194 |
| 2011/0049570 A1* | 3/2011 | Miyoshi et al. | 257/192 |
| 2011/0049571 A1* | 3/2011 | Miyoshi et al. | 257/192 |
| 2011/0062493 A1* | 3/2011 | Miyoshi et al. | 257/190 |
| 2011/0240962 A1* | 10/2011 | Ikuta | C30B 25/18 257/15 |
| 2012/0138944 A1* | 6/2012 | Kanamura et al. | 257/66 |
| 2012/0161152 A1* | 6/2012 | Miyoshi et al. | 257/76 |
| 2012/0168771 A1* | 7/2012 | Miyoshi et al. | 257/76 |
| 2012/0193637 A1* | 8/2012 | Kalnitsky | H01L 29/1066 257/76 |
| 2012/0211765 A1* | 8/2012 | Miyoshi et al. | 257/76 |
| 2012/0217544 A1* | 8/2012 | Ohki | H01L 29/402 257/194 |
| 2013/0026489 A1* | 1/2013 | Gambin et al. | 257/77 |
| 2013/0043488 A1* | 2/2013 | Miyoshi | C30B 25/183 257/76 |
| 2013/0181224 A1* | 7/2013 | Lim | H01L 29/7786 257/76 |
| 2013/0200495 A1* | 8/2013 | Keller | H01L 21/0237 257/615 |
| 2013/0320400 A1* | 12/2013 | Hurkx | H01L 29/417 257/192 |

FOREIGN PATENT DOCUMENTS

| | | |
|---|---|---|
| EP | 1 612 866 A2 | 1/2006 |
| JP | 2000-294768 A1 | 10/2000 |
| JP | 2007-103778 A1 | 4/2007 |
| JP | 2008-227501 A | 9/2008 |
| JP | 2012-119638 A1 | 6/2012 |
| WO | 2009/119356 | 10/2009 |
| WO | 2012/014675 A1 | 2/2012 |

OTHER PUBLICATIONS

Toshihide Kikkawa, "Highly Reliable 250 W High Electron Mobility Transistor Power Amplifier," Japanese Journal of Applied Physics, vol. 44, No. 7A, 2005, pp. 4896-4901.

Stacia Keller, et al., "Gallium Nitride Based High Power Heterojunction Field Effect Transistors: Process Development and Present Status at UCSB," IEEE Transactions on Electron Devices, vol. 48, No. 3, Mar. 2001, pp. 552-559.

F. Medjdoub, et al., "Can InAlN/GaN be an Alternative to High Power / High Temperature AlGaN/GaN Devices?," IEEE IEDM Tech. Digest, 2006, pp. 673-676.

International Search Report dated Nov. 13, 2012.

English Translation of the Written Opinion, PCT International Application No. PCT/JP2012/070521, dated Nov. 13, 2012 (6 pages).

Japanese Office Action, Japanese Application No. 2011-169805, dated Feb. 3, 2015 (2 pages).

European Search Report, European Application No. 12842688.9, dated Aug. 26, 2015 (8 pages).

Xie, Jinqiao, et al. "High Electron Mobility in Nearly Lattice-Matched AlInN/AlN/GaN Heterostructure Field Effect Transistors," Applied Physics Letters, 91, 132116 (2007) (3 pages).

Chinese Office Action, Chinese Application No. 201280003274.5, dated Aug. 3, 2016 (8 pages).

* cited by examiner

SEMICONDUCTOR DEVICE, HEMT DEVICE, AND METHOD OF MANUFACTURING SEMICONDUCTOR DEVICE

BACKGROUND OF THE INVENTION

1. Field of the Invention

The present invention relates to a semiconductor device, and particularly to a semiconductor device in which a Schottky diode junction is established between an epitaxial substrate having a multilayer structure made of a group-III nitride semiconductor and a metal electrode.

2. Description of Related Art

A group-III nitride semiconductor is attracting attention as a semiconductor material for a next-generation high-frequency/high-power device, because the nitride semiconductor has a high breakdown electric field and a high saturation electron velocity. For example, an HEMT (high electron mobility transistor) device in which a barrier layer made of AlGaN and a channel layer made of GaN are laminated takes advantage of the feature that causes a high-concentration two-dimensional electron gas (2DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as silicon and SiC, is used as a base substrate of an HEMT-device substrate. In this case, a buffer layer such as a strained-superlattice layer or a low-temperature growth buffer layer is generally formed as an initially-grown layer on the base substrate. Accordingly, a configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of, for example, AlN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

For example, it is known that, in a case where a nitride HEMT device has the most general configuration in which a channel layer is made of GaN and a barrier layer is made of AlGaN, the concentration of a two-dimensional electron gas existing in an HEMT-device substrate increases as the AlN mole fraction in AlGaN of the barrier layer increases (for example, see Non-Patent Document 2). If the concentration of the two-dimensional electron gas can be considerably increased, the controllable current density of the HEMT device, that is, the power density that can be handled, would be considerably improved.

Also attracting attention is an HEMT device having a structure with reduced strain, such as an HEMT device in which a channel layer is made of GaN and a barrier layer is made of InAlN, in which the dependence on a piezo polarization effect is small and almost only a spontaneous polarization is used to generate a two-dimensional electron gas with a high concentration (for example, see Non-Patent Document 3).

In a case of preparing an HEMT device including a channel layer made of GaN and a barrier layer made of InAlN, a junction formed between a gate electrode and the barrier layer is generally a Schottky junction. In this case, however, depending on the composition of the InAlN layer and the conditions under which the InAlN layer has been formed, there is a possibility that a large leakage current occurs when a reverse voltage is applied to the Schottky junction.

Forming a contact layer made of AlN on the InAlN layer can reduce the leakage current. However, an HEMT device having such a configuration involves a problem that the mobility of a two-dimensional electron gas is low. The cause thereof is assumed to be occurrence of strain in the InAlN layer due to the lattice constant of the AlN layer being smaller than that of the InAlN layer.

PRIOR-ART DOCUMENTS

Non-Patent Documents

Non-Patent Document 1: "Highly Reliable 250 W High Electron Mobility Transistor Power Amplifier", TOSHIHIDE KIKKAWA, Jpn. J. Appl. Phys. 44, (2005), 4896

Non-Patent Document 2: "Gallium Nitride Based High Power Heterojunction Field Effect Transistors: process Development and Present Status at USCB", Stacia Keller, Yi-Feng Wu, Giacinta Parish, Naiqian Ziang, Jane J. Xu, Bernd P. Keller, Steven P. DenBaars, and Umesh K. Mishra, IEEE Trans. Electron Devices 48, (2001), 552

Non-Patent Document 3: "Can InAlN/GaN be an alternative to high power/high temperature AlGaN/GaN devices?", F. Medjdoub, J.-F. Carlin, M. Gonschorek, E. Feltin, M. A. Py, D. Ducatteau, C. Gaquiere, N. Grandjean, and E. Kohn, IEEE IEDM Tech. Digest in IEEE IEDM 2006, 673

SUMMARY OF THE INVENTION

The present invention has been made in view of the problems described above, and an object of the present invention is to provide a semiconductor device in which a reverse leakage current is suppressed and the mobility of a two-dimensional electron gas is high.

To solve the problems described above, a first aspect of the present invention is a semiconductor device including: an epitaxial substrate in which a group of group-III nitride layers are laminated on a base substrate such that a (0001) crystal plane is substantially in parallel with a substrate surface; and a Schottky electrode. The epitaxial substrate includes: a channel layer made of a first group-III nitride having a composition of $In_{x1}Al_{y1}Ga_{z1}N$ (x1+y1+z1=1, z1>0); a barrier layer made of a second group-III nitride having a composition of $In_{x2}Al_{y2}N$ (x2+y2=1, x2>0, y2>0); an intermediate layer made of GaN and adjacent to the barrier layer; and a cap layer made of AlN and adjacent to the intermediate layer. The Schottky electrode is bonded to the cap layer.

A second aspect of the present invention is the semiconductor device according to the first aspect, wherein the intermediate layer has a film thickness of 0.5 nm or more.

A third aspect of the present invention is the semiconductor device according to the second aspect, wherein the intermediate layer has a film thickness of 6 nm or less.

A fourth aspect of the present invention is the semiconductor device according to any one of the first to third aspects, wherein the cap layer has a film thickness of 0.5 nm or more and 6 nm or less.

A fifth aspect of the present invention is the semiconductor device according to the first aspect, wherein the band gap of the second group-III nitride is larger than the band gap of the first group-III nitride.

A sixth aspect of the present invention is the semiconductor device according to the first aspect, wherein the Schottky electrode contains at least one of Ni, Pt, Pd, and Au.

A seventh aspect of the present invention is the semiconductor device according to the first aspect, wherein the cap layer has a root-mean-square surface roughness of 0.5 nm or less.

An eighth aspect of the present invention is the semiconductor device according to the first aspect, wherein the second group-III nitride is $In_{x2}Al_{y2}N$ (x2+y2=1, 0.14≤x2≤0.24).

A ninth aspect of the present invention is the semiconductor device according to the first aspect, wherein the first group-III nitride is $Al_{y1}Ga_{z1}N$ (y1+z1=1, z1>0).

A tenth aspect of the present invention is the semiconductor device according to the ninth aspect, wherein the first group-III nitride is GaN.

An eleventh aspect of the present invention is the semiconductor device according to the ninth aspect, further including a spacer layer provided between the channel layer and the barrier layer, the spacer layer being made of a third group-III nitride having a composition of $In_{x3}Al_{y3}Ga_{z3}N$ (x3+y3+z3=1, y3>0) and having a band gap larger than that of the second group-III nitride.

A twelfth aspect of the present invention is the semiconductor device according to the eleventh aspect, wherein the third group-III nitride is AlN.

A thirteenth aspect of the present invention is the semiconductor device according to the first aspect, wherein an ohmic electrode as well as the Schottky electrode is bonded to the cap layer.

A fourteenth aspect of the present invention is the semiconductor device according to the thirteenth aspect, which is an HEMT device, including the Schottky electrode serving as a gate electrode, and the ohmic electrodes serving as a source electrode and a drain electrode.

A fifteenth aspect of the present invention is a method of manufacturing a semiconductor device. The semiconductor device includes: an epitaxial substrate in which a group of group-III nitride layers are laminated on a base substrate such that a (0001) crystal plane is substantially in parallel with a substrate surface; and a Schottky electrode. The method includes: a channel layer formation step of forming a channel layer on a base substrate, the channel layer being made of a first group-III nitride having a composition of $In_{x1}Al_{y1}Ga_{z1}N$ (x1+y1+z1=1, z1>0); a barrier layer formation step of forming a barrier layer on the channel layer, the barrier layer being made of a second group-III nitride having a composition of $In_{x2}Al_{y2}N$ (x2+y2=1, x2>0, y2>0); an intermediate layer formation step of forming an intermediate layer, the intermediate layer being made of GaN and adjacent to the barrier layer; a cap layer formation step of forming a cap layer, the cap layer being made of AlN and adjacent to the intermediate layer; and a Schottky electrode formation step of forming a Schottky electrode, the Schottky electrode being bonded to the cap layer.

A sixteenth aspect of the present invention is the method of manufacturing the semiconductor device according to the fifteenth aspect, wherein the intermediate layer is formed with a thickness of 0.5 nm or more.

A seventeenth aspect of the present invention is the method of manufacturing the semiconductor device according to the sixteenth aspect, wherein the intermediate layer is formed with a thickness of 6 nm or less.

An eighteenth aspect of the present invention is the method of manufacturing the semiconductor device according to the fifteenth aspect, wherein the cap layer is formed with a thickness of 0.5 nm or more and 6 nm or less.

A nineteenth aspect of the present invention is the method of manufacturing the semiconductor device according to the fifteenth aspect, wherein the band gap of the second group-III nitride is larger than the band gap of the first group-III nitride.

A twentieth aspect of the present invention is the method of manufacturing the semiconductor device according to the fifteenth aspect, wherein, in the Schottky electrode formation step, the Schottky electrode is formed so as to contain at least one of Ni, Pt, Pd, and Au.

A twenty-first aspect of the present invention is the method of manufacturing the semiconductor device according to the fifteenth aspect, wherein the second group-III nitride is $In_{x2}Al_{y2}N$ (x2+y2=1, 0.14≤x2≤0.24).

A twenty-second aspect of the present invention is the method of manufacturing the semiconductor device according to the fifteenth aspect, wherein the first group-III nitride is $Al_{y1}Ga_{z1}N$ (y1+z1=1, z1>0).

A twenty-third aspect of the present invention is the method of manufacturing the semiconductor device according to the twenty-second aspect, wherein the first group-III nitride is GaN.

A twenty-fourth aspect of the present invention is the method of manufacturing the semiconductor device according to the twenty-second aspect, further including a spacer layer formation step of forming a spacer layer between the channel layer and the barrier layer, the spacer layer being made of a third group-III nitride having a composition of $In_{x3}Al_{y3}Ga_{z3}N$ (x3+y3+z3=1, y3>0) and having a band gap larger than that of the second group-III nitride.

A twenty-fifth aspect of the present invention is the method of manufacturing the semiconductor device according to the twenty-fourth aspect, wherein the third group-III nitride is AlN.

A twenty-sixth aspect of the present invention is the method of manufacturing the semiconductor device according to the fifteenth aspect, further including an ohmic electrode formation step of forming an ohmic electrode such that the ohmic electrode is bonded to the cap layer on which the Schottky electrode is formed.

In the first to twenty-sixth aspects of the present invention, the intermediate layer made of GaN and the cap layer made of AlN are provided on the barrier layer in the mentioned order, and an electrode is formed on the cap layer with a Schottky junction, to form an MIS junction. This achieves a semiconductor device in which a reverse leakage current is suppressed and the mobility of a two-dimensional electron gas is kept high as compared with a case where an electrode is formed directly on a barrier layer with a Schottky junction.

DETAILED DESCRIPTION OF THE INVENTION

Configuration of HEMT Device

Figure 1:
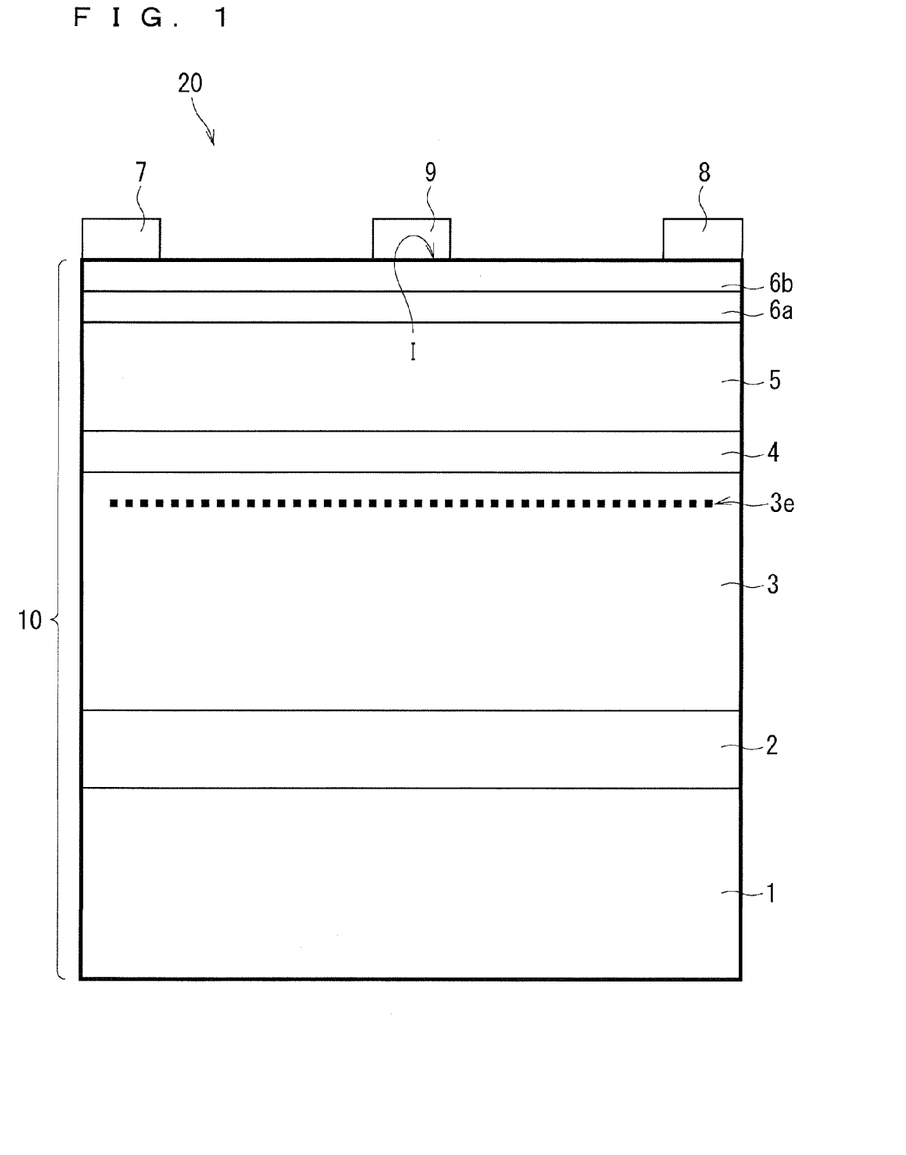
FIG. 1 A schematic cross-sectional view showing an outline configuration of an HEMT device 20 that is one aspect of a semiconductor device according to an embodiment of the present invention.

FIG. 1 is a schematic cross-sectional view showing an outline configuration of an HEMT device 20 that is one aspect of a semiconductor device according to an embodiment of the present invention. Roughly, the HEMT device 20 has a configuration in which a source electrode 7, a drain electrode 8, and a gate electrode 9 are arranged on an epitaxial substrate 10. More specifically, the epitaxial substrate 10 has a configuration in which a base substrate 1, a buffer layer 2, a channel layer 3, a spacer layer 4, a barrier layer 5, an intermediate layer 6a, and a cap layer 6b are laminated. Additionally, the source electrode 7, the drain electrode 8, and the gate electrode 9 are formed on the cap layer 6b. The thickness ratio among the layers shown in FIG. 1 does not reflect the actual ratio. In one preferred example, all of the buffer layer 2, the channel layer 3, the spacer layer 4, the barrier layer 5, the intermediate layer 6a, and the cap layer 6b are epitaxially formed through a MOCVD process (Metal Organic Chemical Vapor Deposition) (details will be described later).

The following description is directed to a case where the MOCVD process is used for the formation of each layer. However, a method appropriately selected from other epitaxial growth processes including vapor deposition processes and liquid phase deposition processes such as MBE, HVPE, and LPE may be adopted, or different growth processes may be adopted in combination, as long as the method can form each of the layers with good crystallinity.

No particular limitation is put on the base substrate 1, as long as the base substrate 1 allows a nitride semiconductor layer with good crystallinity to be formed thereon. In one preferable example, a single crystal 6H—SiC substrate is used. However, a substrate made of sapphire, Si, GaAs, spinel, MgO, ZnO, ferrite, or the like, may be adopted.

The buffer layer 2 is a layer made of AlN, and formed with a thickness of about several hundred nm, for the purpose of obtaining good crystal quality of the channel layer 3, the spacer layer 4, the barrier layer 5, the intermediate layer 6a, and the cap layer 6b which will be formed on the buffer layer 2. In one preferable example, the buffer layer 2 is formed with a thickness of 200 nm.

The channel layer 3 is a layer made of a group-III nitride (first group-III nitride) having a composition of $In_{x1}Al_{y1}Ga_{z1}N$ (x1+y1+z1=1), and formed with a thickness of about several μm. The channel layer 3 is preferably made of a group-III nitride having a composition of $Al_{y1}Ga_{z1}N$ (y1+z1=1, z1>0), and more preferably made of GaN.

The barrier layer 5 is a layer made of a group-III nitride (second group-III nitride) having a composition of $In_{x2}Al_{y2}N$ (x2+y2=1, x2>0, y2>0), and formed with a thickness of about several nm to several tens of nm. Preferably, $0.14 \leq x2 \leq 0.24$ is satisfied. The value of x2 being outside this range is not preferable, because strain acting on the barrier layer 5 exceeds ±0.5%, at which crystal strain starts to increase its influence on the reliability of a Schottky junction.

The channel layer 3 and the barrier layer 5 are formed so as to satisfy such composition ranges that a band gap of the second group-III nitride constituting the latter is greater than a band gap of the first group-III nitride constituting the former.

The intermediate layer 6a is a layer made of GaN. The cap layer 6b is a layer made of AlN. Functions and effects exerted by providing of these intermediate layer 6a and the cap layer 6b in the HEMT device 20 will be described later.

Moreover, the spacer layer 4 is provided between the channel layer 3 and the barrier layer 5. The spacer layer 4 is a layer made of a group-III nitride (third group-III nitride) having a composition of $In_{x3}Al_{y3}Ga_{z4}N$ (x3+y3+z3=1) and containing at least Al (that satisfies y3>0), and formed with a thickness in the range from 0.5 nm to 1.5 nm.

In the epitaxial substrate 10 having such a layer configuration, a two-dimensional electron gas region 3e, in which a two-dimensional electron gas exists with a high concentration, is formed at an interface between the channel layer 3 and the spacer layer 4 (more specifically, in a portion of the channel layer 3 near this interface).

Preferably, the spacer layer 4 and the barrier layer 5 are formed so as to satisfy such composition ranges that a band gap of the third group-III nitride constituting the former is equal to or greater than the band gap of the second group-III nitride constituting the latter. In such a case, an alloy scattering effect is suppressed, and the concentration and the mobility of a two-dimensional electron gas are improved. More preferably, the spacer layer 4 is made of AlN (x3=0, y3=1, z3=0). In this case, the spacer layer 4 is a binary compound of Al and N, which can increase the suppression of the alloy scattering effect as compared with a ternary compound containing Ga. This improves the concentration and mobility of the two-dimensional electron gas. The discussion about these composition ranges does not exclude that the spacer layer 4 contains impurities.

However, it is not essential that the spacer layer 4 is provided in the epitaxial substrate 10. It may be also acceptable that the barrier layer 5 is formed directly on the channel layer 3. In this case, the two-dimensional electron gas region 3e is formed at an interface between the channel layer 3 and the barrier layer 5.

Each of the source electrode 7 and the drain electrode 8 is a multilayer metal electrode in which each metal layer has a thickness of about more than ten nm to one hundred and several tens of nm. Each of the source electrode 7 and the drain electrode 8 has an ohmic contact with the cap layer 6b. The source electrode 7 and the drain electrode 8 may be made of a metal material that provides a good ohmic contact relative to the epitaxial substrate 10 (relative to the cap layer 6b). It is preferable that multilayer metal electrodes made of Ti/Al/Ni/Au are formed as the source electrode 7 and the drain electrode 8. However, this is not limiting. For example, a multilayer metal electrode made of Ti/Al/Pt/Au or Ti/Al may be formed. The formation of the source electrode 7 and the drain electrode 8 can be implemented through a photolithography process and a vacuum vapor deposition process.

On the other hand, the gate electrode 9 is a single-layer or multilayer metal electrode in which one or more metal layers are formed with a thickness of about more than ten nm to one hundred and several tens of nm. The gate electrode 9 has a Schottky contact with the barrier layer 5. It is preferable that the gate electrode 9 is formed by using, as a material thereof, a metal having a high work function, such as Pd, Pt, Ni, or Au. Alternatively, it may be possible that a multilayer metal film consisted of some of the above-mentioned metals or consisted of some of the above-mentioned metals and Al, for example, is formed as the gate electrode 9. Since the cap layer 6b made of AlN is provided, not only the above-mentioned materials but also a metal material that is used for forming an ohmic junction with a group-III nitride semiconductor is also adoptable as a material of the gate electrode 9. For example, a multilayer metal film containing Ti/Al may be formed. This is because, in such a case, a junction is made between AlN having a wide band gap and a metal material having a relatively low work function, which allows a Schottky contact to be relatively easily obtained. The formation of the gate electrode 9 can be implemented through a photolithography process and a vacuum vapor deposition process.

<Schottky Junction Between Cap Layer and Gate Electrode>

In the HEMT device 20 having the above-described configuration, the gate electrode 9, the cap layer 6b, and the barrier layer 5 (more exactly, with interposition of the intermediate layer 6a) form a so-called MIS (metal-insulator-semiconductor) junction. Since the HEMT device 20 has such an MIS junction, in principle, a reverse leakage current is suppressed as compared with a conventional HEMT device in which the gate electrode 9 has a Schottky junction directly with the barrier layer 5. A specific value varies depending on, for example, the composition and the thickness of each part. In a case where the HEMT device 20 has the configuration described in this embodiment, for example, a leakage current caused upon application of −100V is suppressed down to about 1/100 to 1/1000 of a leakage current occurring in a case where a gate electrode is formed directly on a barrier layer.

Figure 2:
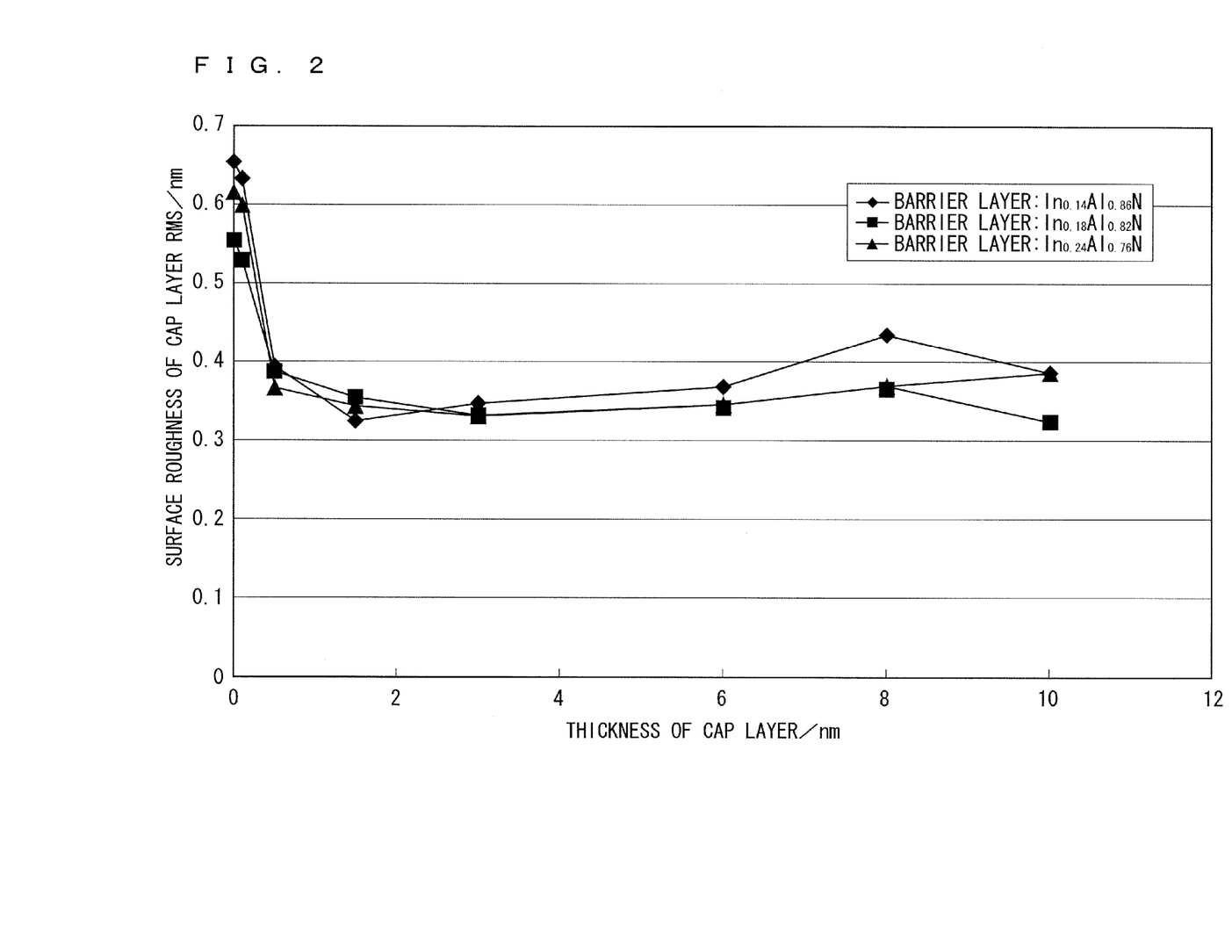
FIG. 2 A diagram illustrating the relationship between the surface roughness and thickness of a cap layer 6b.
Figure 3:
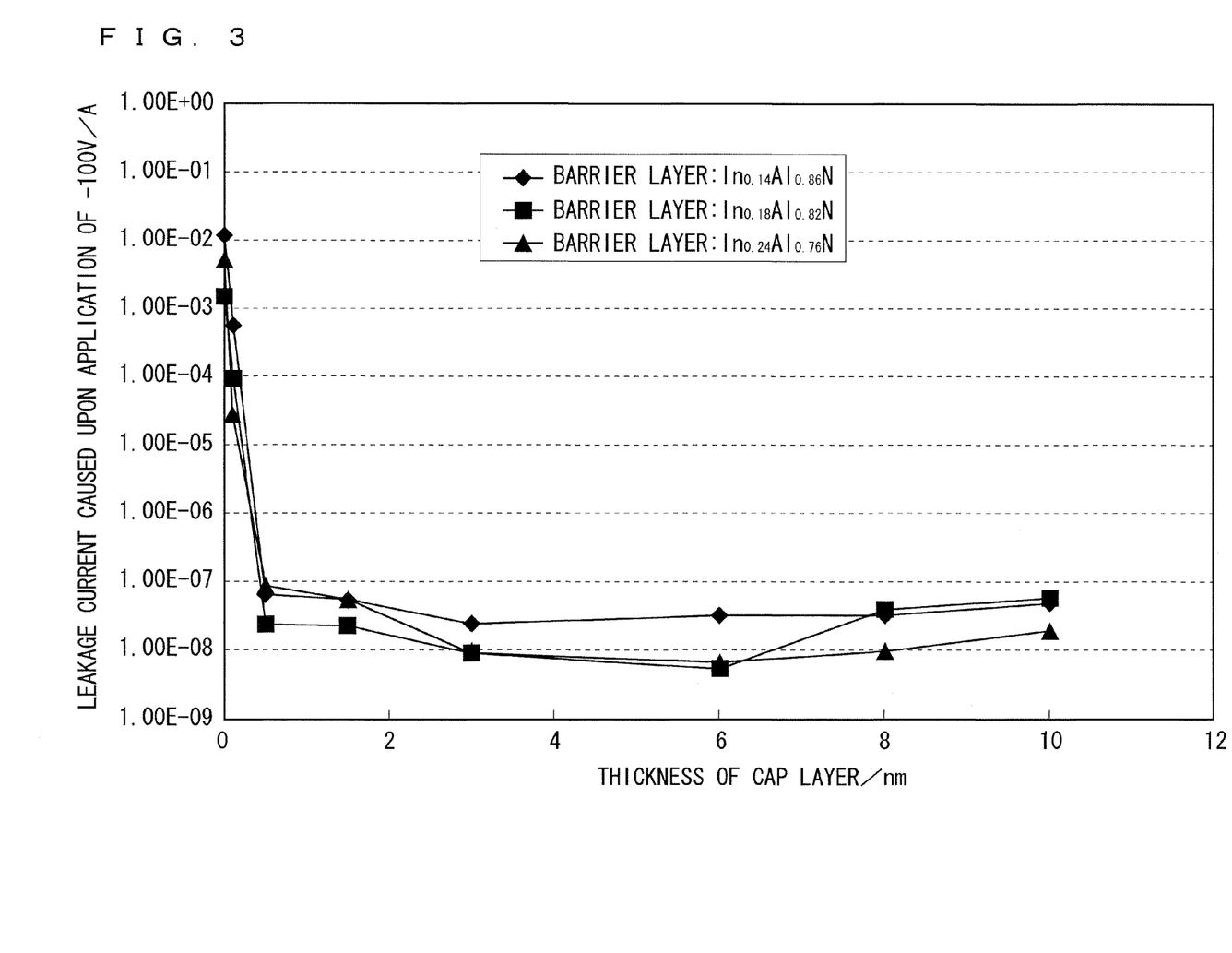
FIG. 3 A diagram illustrating the relationship between a reverse leakage current and the cap layer 6b.
Figure 4:
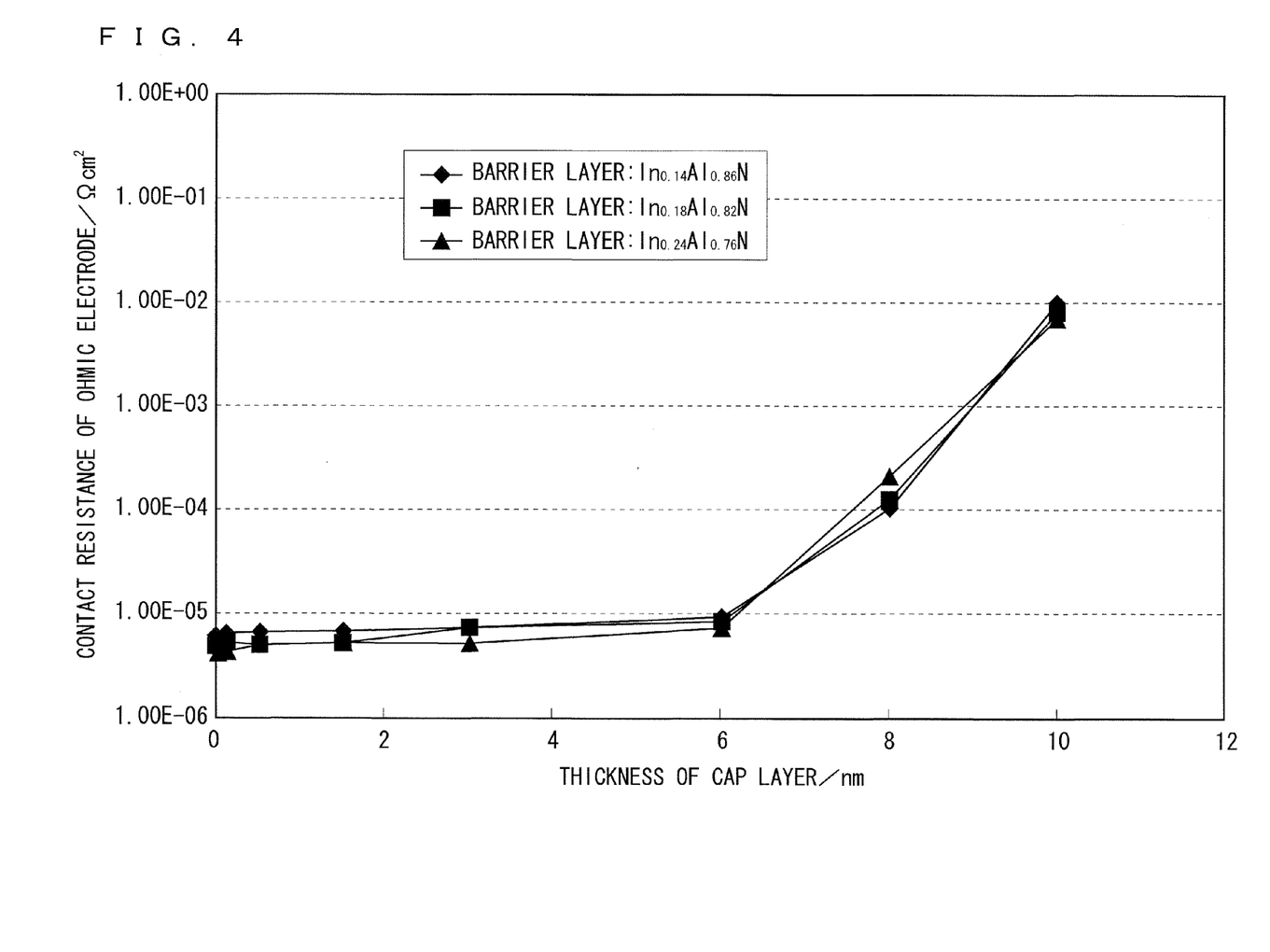
FIG. 4 A diagram plotting a contact resistance of an ohmic electrode against the thickness of the cap layer 6b.

FIGS. 2 to 4 are diagrams for explaining an effect exerted by the HEMT device in which the cap layer 6b is provided immediately below the gate electrode 9, that is, an effect exerted by the HEMT device having the above-described MIS junction. More specifically, FIG. 2 illustrates the relationship between the surface roughness and the thickness of the cap layer 6b with respect to three types of HEMT devices whose barrier layers 5 have three different levels of compositions, namely, $In_{0.14}Al_{0.86}N$, $In_{0.18}Al_{0.82}N$, and $In_{0.24}Al_{0.76}N$. However, for convenience of discussion, the intermediate layer 6a is not provided in these HEMT devices. FIG. 3 illustrates the relationship between a reverse leakage current and the thickness of the cap layer 6b with respect to the same HEMT devices. FIG. 4 illustrates the relationship between a contact resistance and the thickness of the cap layer 6b with respect to the same HEMT devices.

In FIGS. 2 and 3, the value is highest when the thickness of the cap layer 6b is 0 nm (in other words, when the cap layer 6b is not provided), and the value sharply drops until the thickness of the cap layer 6b reaches 0.5 nm, and when the thickness of the cap layer 6b is 0.5 nm or more, the value remains almost unchanged at a value (0.5 nm or less) smaller than the value obtained when the thickness of the cap layer 6b is 0 nm. This means that forming the cap layer 6b with a thickness of 0.5 nm or more can improve the surface flatness thereof and providing the gate electrode 9 on the cap layer 6b having such an excellent surface flatness can reduce the reverse leakage current. The surface of the cap layer 6b is more flattened than the surface of the barrier layer 5.

In FIG. 4, when the thickness of the cap layer 6b is 6 nm or less, the contact resistance is almost constant at a value equal to or less than $1.0×10^{−5}/Ωcm^2$, while when the thickness of the cap layer 6b exceeds 6 nm, the contact resistance rapidly increases. This result indicates that it is preferable that the cap layer 6b has a thickness of 6 nm or less from the viewpoint of keeping a contact resistance of an ohmic electrode at a sufficiently low value.

From the above, it is preferable to form the cap layer 6b with a thickness of 0.5 nm or more and 6 nm or less.

<Relationship Between Intermediate Layer and Two-Dimensional Electron Gas Concentration>

The HEMT device 20 according to this embodiment includes the intermediate layer 6a provided between the barrier layer 5 and the cap layer 6b. This is for the purpose of keeping a high mobility of the two-dimensional electron gas. More specifically, providing the above-described cap layer 6b directly on the barrier layer 5 reduces the mobility of the two-dimensional electron gas, and therefore, in this embodiment, to suppress such reduction, the intermediate layer 6a is formed on the barrier layer 5 and then the cap layer 6b is formed thereon.

The thickness of the intermediate layer 6a is preferably 0.5 nm or more and 6 nm or less. Forming the intermediate layer 6a with a thickness of 0.5 nm or more achieves a higher mobility as compared with when the intermediate layer 6a is not provided. The upper limit of the thickness of the intermediate layer 6a may be set within a range where a sheet resistance is kept so low that no influence is given on it. For example, in a case where the thickness of the cap layer 6b is 0.5 nm or more and 6 nm or less, forming the intermediate layer 6a with a thickness of (0.5 nm or more and) 6 nm or less can reduce the sheet resistance to 300Ω/□ or less.

The HEMT device 20 according to this embodiment is also characterized in that the intermediate layer 6a and the cap layer 6b are formed over the whole surface of the barrier layer 5 so that they are uniformly provided not only immediately below the gate electrode 9 but also immediately below the source electrode 7 and the drain electrode 8. In fact, the function and effect of reduction in the reverse leakage current are obtained as long as the intermediate layer 6a and the cap layer 6b exist only immediately below the gate electrode 9, but to achieve such a configuration, a photolithography process, an etching process, and the like, are required, which may cause a cost increase. This embodiment forms the intermediate layer 6a and the cap layer 6b over the whole surface of the barrier layer 5, without those processes. Therefore, it can be also said that an HEMT device having excellent characteristics is achieved with suppression of the costs. Needless to say, it may be also possible that, in order to form the source electrode 7 and the drain electrode 8 directly on the barrier layer 5, a so-called recessed ohmic in which the cap layer 6b, the intermediate layer 6a, and the barrier layer 5 are partially removed by etching is performed prior to forming those electrodes, and then the source electrode 7 and the drain electrode 8 are formed on the barrier layer 5 exposed as a result of the etching.

<Method for Preparing HEMT Device>

Next, a method for preparing the HEMT device 20 having the above-described configuration will be described.

The preparation of the epitaxial substrate 10 can be performed by using a known MOCVD apparatus. More specifically, an MOCVD apparatus is used that is configured to feed, into a reactor, a metal organic (MO) source gas (TMI, TMA and TMG) for In, Al and Ga, an ammonia gas ($NH_3$ gas), a hydrogen gas, and a nitrogen gas.

Firstly, for example, a (0001)-oriented 6H—SiC substrate having a diameter of two inches is prepared as the base substrate 1, and this base substrate 1 is placed on a susceptor provided in a reactor of the MOCVD apparatus. The inside of the reactor is vacuumed, and then, an atmosphere in a hydrogen/nitrogen mixed flow state is created while a pressure inside the reactor is kept at a predetermined value in the range from 5 kPa to 50 kPa. In this condition, the susceptor is heated to thereby raise the temperature of the substrate.

When the temperature of the susceptor reaches a predetermined temperature in the range from 950° C. to 1250° C. (for example, 1050° C.), which is a buffer layer formation temperature, an Al source gas and a $NH_3$ gas are introduced into the reactor, and thereby an AlN layer serving as the buffer layer 2 is formed.

After the formation of the AlN layer, the temperature of the susceptor is kept at a predetermined channel layer formation temperature, and a metal organic source gas and an ammonia gas are introduced into the reactor in accordance with the composition of the channel layer 3, and thereby an $In_{x1}Al_{y1}Ga_{z1}N$ layer (x1=0, 0≤y1≤0.3) serving as the channel layer 3 is formed. Here, the channel layer formation temperature T1 is a value determined in a temperature range of 950° C. or more and 1250° C. or less in accordance with a value of an AlN mole fraction y1 in the channel layer 3. No particular limitation is put on the pressure in the reactor at a time when the channel layer 3 is formed. A pressure can be appropriately selected from the range from 10 kPa to an atmospheric pressure (100 kPa).

After the formation of the $In_{x1}Al_{y1}Ga_{z1}N$ layer, a nitrogen gas atmosphere inside the reactor is maintained while the temperature of the susceptor is kept. The pressure in the reactor is set to be 10 kPa, and then a metal organic source gas and an ammonia gas are introduced into the reactor, so that an $In_{x3}Al_{y3}Ga_{z3}N$ layer serving as the spacer layer 4 is formed with a predetermined thickness.

After the formation of the $In_{x3}Al_{y3}Ga_{z3}N$ layer, then, in order to form an $In_{x2}Al_{y2}N$ serving as the barrier layer 5, the temperature of the susceptor is kept at a predetermined barrier layer formation temperature that is 650° C. or more and 800° C. or less, and the pressure in the reactor is kept at a predetermined value in the range from 1 kPa to 30 kPa. Then, an ammonia gas and a metal organic source gas with a flow ratio in accordance with the composition of the barrier layer 5 are introduced into the reactor such that the so-called V/III ratio has a predetermined value of 3000 or more and 20000 or less.

After the formation of the $In_{x3}Al_{y3}Ga_{z3}N$ layer, then the temperature of the susceptor is set to be a predetermined intermediate layer formation temperature. In this condition, a TMG and a $NH_3$ gas are fed, so that a GaN layer serving as the intermediate layer 6a is formed with a predetermined thickness.

After the formation of the GaN layer, then the temperature of the susceptor is set to be a predetermined cap layer formation temperature. In this condition, a TMA and a $NH_3$ gas are fed, so that an AlN layer serving as the cap layer 6b is formed with a predetermined thickness. Upon the formation of the cap layer 6b, the preparation of the epitaxial substrate 10 is completed.

After the formation of the epitaxial substrate 10, this is used to prepare an HEMT device. Subsequent steps are achieved through a known method.

Firstly, through a photolithography process and a vacuum vapor deposition process, multilayer metal patterns serving as the source electrode 7 and the drain electrode 8 are formed in expected formation positions on the cap layer 6b.

Then, in order to give excellent ohmic characteristics to the source electrode 7 and the drain electrode 8, the epitaxial substrate 10 having these source electrode 7 and drain electrode 8 formed thereon is subjected to a heat treatment for several tens of seconds in a nitrogen gas atmosphere at a predetermined temperature of 650° C. to 1000° C.

Then, through a photolithography process and a vacuum vapor deposition process, a multilayer metal pattern serving as the gate electrode 9 is formed in an expected formation position on the cap layer 6b.

Then, a resultant is singulated into chips each having a predetermined size. Thereby, a large number of HEMT devices 20 are obtained. On the HEMT device 20 thus obtained, die bonding and wire bonding are performed as appropriate.

As thus far described, in this embodiment, an intermediate layer made of GaN is provided on a barrier layer, and a cap layer made of AlN is additionally provided, and a gate electrode is formed on the cap layer with a Schottky junction, to form an MIS junction. This achieves an HEMT device in which a reverse leakage current is largely reduced and the mobility of the two-dimensional electron gas is high as compared with a case where a gate electrode is formed directly on a barrier layer with a Schottky junction.

<Modification>

Although the description of the above-described embodiment has been given with respect to an HEMT device, the aspect of forming an MIS junction between a gate electrode and a barrier layer is also applicable to other electronic devices using a Schottky junction, such as a Schottky barrier diode and a photosensor.

In the above-described embodiment, the cap layer 6b is made of AlN. However, the cap layer 6b may be made of a group-III nitride having insulating properties and having a band gap larger than that of the second group-III nitride. Here, a group-III nitride having insulating properties means a group-III nitride whose specific resistance is $10^8$ Ωcm or more. When the specific resistance is in this range, the above-described MIS junction is successfully formed. As long as the specific resistance satisfies this range, the presence of conductive impurities in the cap layer 6b is allowed.

EXAMPLES

Example 1, Comparative Example 1, and Comparative Example 2

In an example 1, the epitaxial substrate 10 according to the above-described embodiment including the intermediate layer 6a and the cap layer 6b was prepared, and evaluated for the two-dimensional electron gas concentration, the mobility of the two-dimensional electron gas, and the sheet resistance. Then, by using this epitaxial substrate 10, four types of HEMT devices 20 were prepared which were different from one another in terms of the configuration of the gate electrode 9. Each of the HEMT devices 20 was evaluated for a reverse leakage current caused upon application of −100V.

In a comparative example 1, an epitaxial substrate including neither the intermediate layer 6a nor the cap layer 6b was prepared, and evaluated for the two-dimensional electron gas concentration, the mobility of the two-dimensional electron gas, and the sheet resistance. Then, similarly to the example 1, the gate electrode 9 was formed on this epitaxial substrate, to thereby prepare four types of HEMT devices. Each of the HEMT devices was evaluated for a reverse leakage current caused upon application of −100V.

Furthermore, in a comparative example 2, an epitaxial substrate not including the intermediate layer 6a and including only the cap layer 6b was prepared, and evaluated for the two-dimensional electron gas concentration, the mobility of the two-dimensional electron gas, and the sheet resistance.

Then, similarly to the example 1, the gate electrode 9 was formed on the epitaxial substrate, to thereby prepare four types of HEMT devices. Each of the HEMT devices was evaluated for a reverse leakage current caused upon application of −100V.

That is, four types of gate electrodes 9 having different configurations were formed on each of the three types of epitaxial substrates. Thus, twelve types of HEMT devices in total were obtained.

Firstly, the epitaxial substrate 10 was prepared. Until the formation of the spacer layer 4, all the epitaxial substrates 10 were prepared under the same conditions.

To be specific, firstly, a plurality of (0001)-oriented 6H—SiC substrates having a diameter of two inches were prepared as the base substrate 1. The thickness thereof was 300 μm. Each of the substrates was placed in a reactor of an MOCVD apparatus, and the inside of the reactor was vacuumed. Then, the pressure in the reactor was set to be 30 kPa, and an atmosphere in a hydrogen/nitrogen mixed flow state was created. Then, the susceptor was heated, to thereby raise the temperature of the base substrate 1.

After the temperature of the susceptor reached 1050° C., a TMA bubbling gas and an ammonia gas were introduced into the reactor, and an AlN layer having a thickness of 200 nm was formed as the buffer layer.

Then, the temperature of the susceptor was set to be a predetermined temperature, a TMG bubbling gas serving as the metal organic source gas and an ammonia gas were introduced into the reactor with a predetermined flow ratio. Thus, a GaN layer serving as the channel layer 3 was formed with a thickness of 2 μm.

After the formation of the channel layer 3, the pressure in the reactor was set to be 10 kPa, and then a TMA bubbling gas and an ammonia gas were introduced into the reactor. Thus, an AlN layer having a thickness of 1 nm was formed as the spacer layer 4.

After the formation of the spacer layer 4, the barrier layer 5 was then formed with a thickness of 15 nm. The composition of the barrier layer 5 was $In_{0.18}Al_{0.82}N$. The temperature of the susceptor was 745° C.

After the formation of the barrier layer 5, in the example 1, the temperature of the susceptor was kept at 745° C. which is the barrier layer formation temperature, and in this condition a GaN layer serving as the intermediate layer 6a was formed with a thickness of 3 nm, and then an AlN layer serving as the cap layer 6b was formed with a thickness of 3 nm. In the comparative example 2, the cap layer 6b was formed with a thickness of 3 nm. In the comparative example 1, nothing was formed.

In each of the epitaxial substrates, after the final layer was formed, the temperature of the susceptor was lowered to the vicinity of a room temperature, and the inside of the reactor was returned to the atmospheric pressure. Then, the prepared epitaxial substrates 10 were taken out. Through the above-described procedures, each of the epitaxial substrates 10 was obtained.

Then, a part of each of the epitaxial substrates was cut out in a singulating manner. A specimen to be evaluated thus obtained was subjected to Hall effect measurement. In this measurement, the two-dimensional electron gas concentration, the two-dimensional electron gas mobility, and the sheet resistance was obtained with respect to each of the epitaxial substrates.

Then, through a photolithography process and a vacuum vapor deposition process, an electrode pattern made of Ti/Al/Ni/Au (with film thicknesses of 25/75/15/100 nm, respectively) was formed on an upper surface of each epitaxial substrate in expected formation positions where the source electrode 7 and the drain electrode 8 were to be formed. Then, a heat treatment was performed in nitrogen for 30 seconds at 800° C.

Then, through a photolithography process and a vacuum vapor deposition process, a pattern of the gate electrode 9 was formed on the upper surface of each epitaxial substrate in an expected formation position where the gate electrode 9 was to be formed. Here, four types of gate electrodes 9 in total were formed, namely, a single layer metal electrode (12 nm) made of Au only and three types of multilayer metal electrodes made of Ni/Au (with film thicknesses of 6 nm/12 nm), Pd/Au (with film thicknesses of 6 nm/12 nm), and Pt/Au (with film thicknesses of 6 nm/12 nm). The gate electrode 9 was formed such that the gate length was 1 μm, the gate width was 100 μm, the interval between the gate electrode 9 and the source electrode 7 was 2 μm, and the interval between the gate electrode 9 and the drain electrode 8 was 10 μm.

Finally, a resultant was singulated into chips. Thus, an HEMT device was obtained.

Die bonding and wire bonding were performed on the obtained HEMT device, and then a reverse leakage current caused upon application of −100V was measured.

Table 1 shows a list of, with respect to each of the HEMT devices, the configurations of the intermediate layer 6a and the cap layer 6b of the epitaxial substrate, the two-dimensional electron gas concentration, the mobility of the two-dimensional electron gas, the sheet resistance, the configuration of the gate electrode of the HEMT device, and a result of measurement of the reverse leakage current caused upon application of −100V.

TABLE 1

|  |  | Configuration of Epitaxial Substrate | Two-Dimensional Electron Gas Concentration (/cm$^2$) | Mobility of Two-Dimensional Electron Gas (cm$^2$/Vs) | Sheet Resistance (Ω/□) | Configuration of Gate Metal | Leakage Current (A) (Upon Application of −100 V) |
|---|---|---|---|---|---|---|---|
| Example 1 |  | Intermediate Layer: GaN (Thickness 3 nm) Cap Layer: AlN (Thickness 3 nm) | 2.35E+13 | 980 | 271 | Ni/Au Pd/Au Pt/Au Au | 1.46E−08 1.04E−08 4.62E−09 1.12E−08 |
| Comparative Example 1 |  | Intermediate Layer: Non Cap Layer: Non | 2.30E+13 | 990 | 274 | Ni/Au Pd/Au Pt/Au Au | 2.88E−05 1.92E−05 9.26E−06 2.34E−05 |

TABLE 1-continued

|  | Configuration of Epitaxial Substrate | Two-Dimensional Electron Gas Concentration (/cm$^2$) | Mobility of Two-Dimensional Electron Gas (cm$^2$/Vs) | Sheet Resistance (Ω/□) | Configuration of Gate Metal | Leakage Current (A) (Upon Application of −100 V) |
|---|---|---|---|---|---|---|
| Comparative Example 2 | Intermediate Layer: Non Cap Layer: AlN (Thickness 3 nm) | 2.50E+13 | 650 | 384 | Ni/Au<br>Pd/Au<br>Pt/Au<br>Au | 2.62E−08<br>2.21E−08<br>1.12E−08<br>2.40E−08 |

The results shown in Table 1 reveal that, in all the HEMT devices according to the example 1, that is, irrespective of the configuration of the gate electrode 9, the reverse leakage currents were suppressed to about 1/100 to 1/1000 of the reverse leakage currents in the HEMT devices according to the comparative example 1 in which the preparation was performed under the same conditions except the intermediate layer 6a and the cap layer 6b. It is also revealed that there is almost no difference between the example 1 and the comparative example 1 in terms of the two-dimensional electron gas concentration, the mobility of the two-dimensional electron gas, and the sheet resistance.

On the other hand, in the HEMT devices according to the comparative example 2 in which the intermediate layer 6a was not provided and only the cap layer 6b was provided, the reverse leakage current was suppressed to the same level as in the example 1, but the mobility of the two-dimensional electron gas was lower than in the example 1 and the comparative example 1 while the sheet resistance was higher than in the example 1 and the comparative example 1.

The above-described results indicate that providing the cap layer 6b directly on the barrier layer 5 exerts an effect of reducing the leakage current, but on the other hand, has a disadvantage in that the mobility of the two-dimensional electron gas and the sheet resistance are deteriorated, and also indicate that interposing the intermediate layer 6a between those layers can suppress deterioration in the sheet resistance, which is otherwise caused by reduction in the mobility of the two-dimensional electron gas, while maintaining the effect of reducing the leakage current exerted by the cap layer 6b.

In other words, providing the cap layer 6b with the intermediate layer 6a being provided on the barrier layer 5 exerts an effect in terms of reducing the reverse leakage current while maintaining a good two-dimensional electron gas concentration and a good sheet resistance.

Example 2

In this example, HEMT devices whose intermediate layers 6a had different thicknesses, including a case of providing no intermediate layer 6a, were prepared. More specifically, the HEMT devices were prepared through the same procedures as in the example 1, except that the thickness of the intermediate layer 6a was varied in eight levels of 0 nm, 0.1 nm, 0.5 nm, 1.5 nm, 3 nm, 6 nm, 8 nm, and 10 nm and that the material of the gate electrode 9 was only Ni/Au (with film thicknesses of 6 nm/12 nm).

In the course of preparation of the HEMT devices, at a time when the epitaxial substrates were obtained, Hall effect measurement was performed similarly to the example 1. Thereby, the two-dimensional electron gas concentration, the mobility of the two-dimensional electron gas, and the sheet resistance were obtained with respect to each of the epitaxial substrates.

Additionally, similarly to the example 1, a reverse leakage current was measured with respect to the obtained HEMT devices.

Table 2 shows a list of, with respect to each of the HEMT devices, the film thickness of the intermediate layer 6a of the epitaxial substrate, the two-dimensional electron gas concentration, the mobility of the two-dimensional electron gas, the sheet resistance, and a result of measurement of the reverse leakage current caused in the HEMT device upon application of −100V.

TABLE 2

|  | Film Thickness of Intermediate Layer (nm) | Two-Dimensional Electron Gas Concentration (/cm$^2$) | Mobility of Two-Dimensional Electron Gas (cm$^2$/Vs) | Sheet Resistance (Ω/□) | Leakage Current (A) (Upon Application of −100 V) |
|---|---|---|---|---|---|
| Example 2 | 0 | 2.50E+13 | 650 | 384 | 2.62E−08 |
|  | 0.1 | 2.48E+13 | 655 | 384 | 2.18E−08 |
|  | 0.5 | 2.43E+13 | 975 | 263 | 1.86E−08 |
|  | 1.5 | 2.38E+13 | 982 | 267 | 1.42E−08 |
|  | 3 | 2.35E+13 | 980 | 271 | 1.46E−08 |
|  | 6 | 2.15E+13 | 988 | 294 | 1.36E−08 |
|  | 8 | 1.02E+13 | 988 | 619 | 1.56E−08 |
|  | 10 | 8.50E+12 | 985 | 745 | 1.49E−08 |

As shown in Table 2, when the thickness of the intermediate layer 6a is 0.5 nm or more, the value of the mobility of the two-dimensional electron gas is higher than when the intermediate layer 6a is not provided. When the thickness of the intermediate layer 6a is 6 nm or less, the value of the two-dimensional electron gas concentration is at a similar level to that obtained when the intermediate layer 6a is not provided. When the thickness of the intermediate layer 6a is 0.5 nm or more and 6 nm or less, the sheet resistance is kept at a value equal to or less than 300Ω/□, which is lower than when the intermediate layer 6a is not provided.

On the other hand, as shown in Table 2, in any of the HEMT devices, the value of the leakage current is reduced to 1/1000 or less of that obtained in the comparative example 1 (in the similar case where the gate electrode was Ni/Au) shown in Table 1.

From the above, it is revealed that forming the intermediate layer 6a with a thickness of 0.5 nm or more between the cap layer 6b and the barrier layer 5 achieves an HEMT device in which a leakage current is reduced and the mobility of a two-dimensional electron gas is high. It is further revealed that forming the intermediate layer 6a with a thickness of 6 nm or less achieves an HEMT device having a high two-dimensional electron gas concentration and a low sheet resistance.

The invention claimed is:

1. A semiconductor device comprising:
an epitaxial substrate in which a group of group-III nitride layers are laminated on a base substrate such that a (0001) crystal plane is substantially in parallel with a substrate surface; and
a Schottky electrode,
wherein said epitaxial substrate includes:
a channel layer made of a first group-III nitride having a composition of $In_{x1}Al_{y1}Ga_{z1}N$ (x1+y1+z1=1, z1>0);
a barrier layer made of a second group-III nitride having a composition of $In_{x2}Al_{y2}N$ (x2+y2=1, x2>0, y2>0);
an intermediate layer made of GaN and formed adjacent to an upper surface of said barrier layer; and
a cap layer made of AlN and adjacent to said intermediate layer,
said Schottky electrode is bonded to said cap layer,
wherein said intermediate layer is formed over an entirety of the upper surface of said barrier layer, and said cap layer is formed over an entirety of an upper surface of said intermediate layer,
wherein said intermediate layer has a film thickness of 0.5 am or more and 6 nm or less, and said cap layer has a film thickness of 0.5 nm or more and 6 am or less.

2. The semiconductor device according to claim 1, wherein
the band gap of said second group-III nitride is larger than the band gap of said first group-III nitride.

3. The semiconductor device according to claim 1, wherein said Schottky electrode contains at least one of Ni, Pt, Pd, and Au.

4. The semiconductor device according to claim 1, wherein said cap layer has a root-mean-square surface roughness of 0.5 nm or less.

5. The semiconductor device according to claim 1, wherein said second group-III nitride is $In_{x2}Al_{y2}N$ (x2+y2=1, 0.14≤x2≤0.24).

6. The semiconductor device according to claim 1, wherein said first group-III nitride is $Al_{y1}Ga_{z1}N$ (y1+z1=1, z1>0).

7. The semiconductor device according to claim 6, wherein said first group-III nitride is GaN.

8. The semiconductor device according to claim 6, further comprising
a spacer layer provided between said channel layer and said barrier layer, said spacer layer being made of a third group-III nitride having a composition of $In_{x3}Al_{y3}Ga_{z3}N$ (x3+y3+z3=1, y3>0) and having a band gap larger than that of said second group-III nitride.

9. The semiconductor device according to claim 8, wherein said third group-III nitride is AlN.

10. The semiconductor device according to claim 1, wherein an ohmic electrode as well as said Schottky electrode is bonded to said cap layer.

11. The semiconductor device according to claim 10, which is an REMT device, comprising said Schottky electrode serving as a gate electrode, and said ohmic electrodes serving as a source electrode and a drain electrode.

12. A method of manufacturing a semiconductor device, said semiconductor device comprising:
an epitaxial substrate in which a group of group-III nitride layers are laminated on a base substrate such that a (0001) crystal plane is substantially in parallel with a substrate surface; and
a Schottky electrode,
said method comprising:
a channel layer formation step of forming a channel layer on a base substrate, said channel layer being made of a first group-III nitride having a composition of $In_{x1}Al_{y1}Ga, N$ (x1+y1+z1=1, z1>0);
a barrier layer formation step of forming a barrier layer on said channel layer, said barrier layer being made of a second group-III nitride having a composition of $In_{x2}Al_{y2}N$ (x2+y2=1, x2>0, y2>0);
an intermediate layer formation step of forming an intermediate layer, said intermediate layer being made of GaN and formed adjacent to an upper surface of said barrier layer;
a cap layer formation step of forming a cap layer, said cap layer being made of AlN and adjacent to said intermediate layer; and
a Schottky electrode formation step of forming a Schottky electrode, said Schottky electrode being bonded to said cap layer,
wherein said intermediate layer is formed over an entirety of the upper surface of said barrier layer, and said cap layer is formed over an entirety of an upper surface of said intermediate layer,
wherein said intermediate layer is formed with a thickness of 0.5 nm or more and 6 nm or less, and said cap layer is formed with a thickness of 0.5 nm or more and 6 nm or less.

13. The method of manufacturing the semiconductor device according to claim 12, wherein the band gap of said second group-III nitride is larger than the band gap of said first group-III nitride.

14. The method of manufacturing the semiconductor device according to claim 12, wherein in said Schottky electrode formation step, said Schottky electrode is formed so as to contain at least one of Ni, Pt, Pd, and Au.

15. The method of manufacturing the semiconductor device according to claim 12, wherein said second group-III nitride is $In_{x2}Al_{y2}N$ (x2+y2=1, 0.14≤x2≤0.24).

16. The method of manufacturing the semiconductor device according to claim 12, wherein said first group-III nitride is $Al_{y1}Ga_{z1}N$ (y1+z1=1, z1>0).

17. The method of manufacturing the semiconductor device according to claim 16, wherein said first group-III nitride is GaN.

18. The method of manufacturing the semiconductor device according to claim 16, further comprising
a spacer layer formation step of forming a spacer layer between said channel layer and said barrier layer, said spacer layer being made of a third group-III nitride having a composition of $In_{x3}Al_{y3}Ga_{z3}N$ (x3+y3+z3=1, y3>0) and having a band gap larger than that of said second group-III nitride.

19. The method of manufacturing the semiconductor device according to claim 18, wherein said third group-III nitride is AlN.

20. The method of manufacturing the semiconductor device according to claim 12, further comprising an ohmic electrode formation step of forming an ohmic electrode such that said ohmic electrode is bonded to said cap layer on which said Schottky electrode is formed.

21. The semiconductor device according to claim 1, wherein said intermediate layer consists of GaN.

22. The method of manufacturing the semiconductor device according to claim 12, wherein said intermediate layer consists of GaN.

* * * * *